US010811233B2

(12) United States Patent
Nguyen et al.

(10) Patent No.: US 10,811,233 B2
(45) Date of Patent: Oct. 20, 2020

(54) PROCESS CHAMBER HAVING TUNABLE SHOWERHEAD AND TUNABLE LINER

(71) Applicant: APPLIED MATERIALS, INC., Santa Clara, CA (US)

(72) Inventors: Andrew Nguyen, San Jose, CA (US); Xue Yang Chang, San Jose, CA (US); Haitao Wang, Sunnyvale, CA (US); Kei-Yu Ko, San Jose, CA (US); Reza Sadjadi, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 230 days.

(21) Appl. No.: 15/673,403

(22) Filed: Aug. 9, 2017

(65) Prior Publication Data
US 2018/0047544 A1 Feb. 15, 2018

Related U.S. Application Data

(60) Provisional application No. 62/374,837, filed on Aug. 13, 2016.

(51) Int. Cl.
*H01J 37/32* (2006.01)

(52) U.S. Cl.
CPC .. *H01J 37/32449* (2013.01); *H01J 37/32183* (2013.01); *H01J 37/32477* (2013.01); *H01J 37/32899* (2013.01); *H01J 2237/332* (2013.01); *H01J 2237/334* (2013.01)

(58) Field of Classification Search
CPC ........... H01J 37/32449; H01J 37/32183; H01J 37/32477; H01J 37/32899; H01J 2237/332; H01J 2237/334
See application file for complete search history.

(56) References Cited

U.S. PATENT DOCUMENTS

| 6,277,237 B1 * | 8/2001 | Schoepp ........... H01J 37/32495 |
| | | 156/345.1 |
| 6,551,447 B1 * | 4/2003 | Savas .................... H01J 37/321 |
| 9,593,411 B2 | 3/2017 | Hoffman et al. |
| 2003/0037881 A1 * | 2/2003 | Barnes .............. H01J 37/32082 |
| | | 156/345.44 |
| 2005/0001556 A1 | 1/2005 | Hoffman et al. |
| 2015/0053644 A1 | 2/2015 | Nam et al. |
| 2015/0348763 A1 | 12/2015 | Mori et al. |

FOREIGN PATENT DOCUMENTS

| KR | 10-0433006 | 4/2003 |
| WO | WO 96-15545 A1 | 5/1996 |

OTHER PUBLICATIONS

International Search Report and Written Opinion dated Nov. 22, 2017 received for PCT Application No. PCT/US2017/046268.

\* cited by examiner

*Primary Examiner* — Kelly M Gambetta
(74) *Attorney, Agent, or Firm* — Moser Taboada

(57) ABSTRACT

Process chambers having a tunable showerhead and a tunable liner are disclosed herein. In some embodiments, a processing chamber includes a showerhead; a chamber liner; a first impedance circuit coupled to the showerhead to tune an impedance of the showerhead; a second impedance circuit coupled to the chamber liner to tune an impedance of the chamber liner; and a controller coupled to the first and second impedance circuits to control relative impedances of the showerhead and the chamber liner.

18 Claims, 2 Drawing Sheets

PROCESS CHAMBER HAVING TUNABLE SHOWERHEAD AND TUNABLE LINER

CROSS-REFERENCE TO RELATED APPLICATIONS

This application claims the benefit of U.S. Provisional Patent Application No. 62/374,837, filed with the United States Patent Office on Aug. 13, 2016, which is herein incorporated by reference in its entirety.

FIELD

Embodiments of the disclosure generally relate to method and apparatus for processing a substrate.

BACKGROUND

During etching or plasma assisted chemical vapor deposition (PCVD) of a substrate, non-symmetries of the processing chamber and the non-linearity (i.e., skew) of the plasma negatively impact the etch rate or deposition uniformity on the substrate.

Therefore, the inventors have provided an improved process chamber.

SUMMARY

Process chambers having tunable components are disclosed herein. In some embodiments, a processing chamber includes a showerhead; a chamber liner; a first impedance circuit coupled to the showerhead to tune an impedance of the showerhead; a second impedance circuit coupled to the chamber liner to tune an impedance of the chamber liner; and a controller coupled to the first and second impedance circuits to control relative impedances of the showerhead and the chamber liner.

In some embodiments, a tandem process chamber includes a first process chamber and a second process chamber. The first process chamber includes a first showerhead; a first chamber liner; a first impedance circuit coupled to the first showerhead to tune an impedance of the first showerhead; a second impedance circuit coupled to the first chamber liner to tune an impedance of the first chamber liner; and a first controller coupled to the first and second impedance circuits to control relative impedances of the first showerhead and the first chamber liner. The second process chamber includes a second showerhead; a second chamber liner; a third impedance circuit coupled to the second showerhead to tune an impedance of the second showerhead; a fourth impedance circuit coupled to the second chamber liner to tune an impedance of the second chamber liner; and a second controller coupled to the first and second impedance circuits to control relative impedances of the second showerhead and the second chamber liner.

In some embodiments, a tandem process chamber includes a first process chamber and a second process chamber. The first process chamber includes a first showerhead; a first insulative ring disposed between the first showerhead and walls of the first process chamber to electrically insulate the first showerhead from the first process chamber; a first chamber liner; a second insulative ring disposed between the first chamber liner and walls of the first process chamber to electrically insulate the first chamber liner from the first process chamber; a first impedance circuit coupled to the first showerhead to tune an impedance of the first showerhead; a second impedance circuit coupled to the first chamber liner to tune an impedance of the first chamber liner; and a first controller coupled to the first and second impedance circuits to control relative impedances of the first showerhead and the first chamber liner. The second process chamber includes a second showerhead; a third insulative ring disposed between the second showerhead and walls of the second process chamber to electrically insulate the second showerhead from the second process chamber; a second chamber liner; a fourth insulative ring disposed between the second chamber liner and walls of the second process chamber to electrically insulate the second chamber liner from the second process chamber; a third impedance circuit coupled to the second showerhead to tune an impedance of the second showerhead; a fourth impedance circuit coupled to the second chamber liner to tune an impedance of the second chamber liner; and a second controller coupled to the first and second impedance circuits to control relative impedances of the second showerhead and the second chamber liner. Each of the first, second, third, and fourth impedance circuits includes a first tunable capacitor, a second tunable capacitor; and a series inductor-resistor (LR) circuit disposed in series with the first tunable capacitor.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
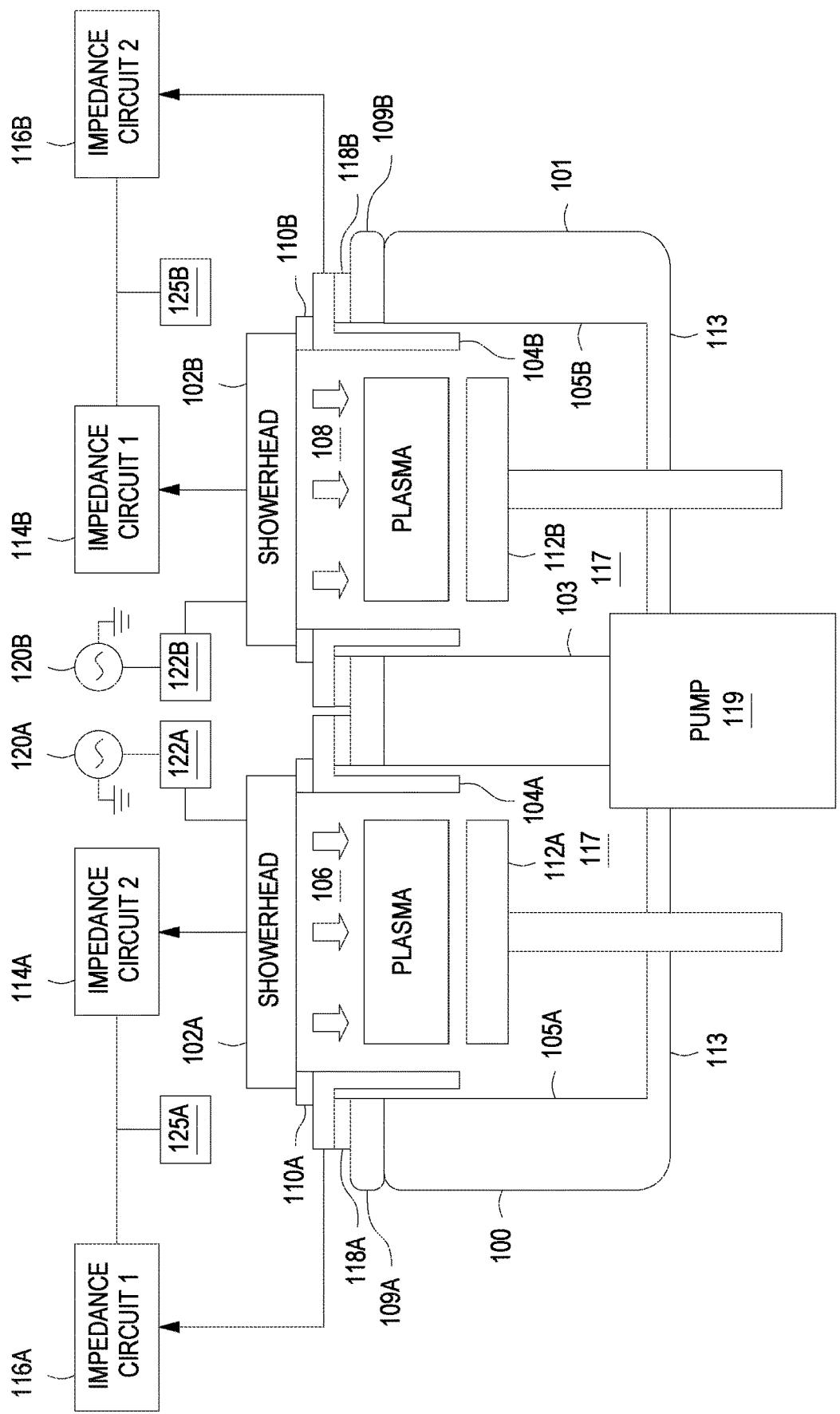
FIG. 1 depicts a schematic view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to a process chamber with tunable components. Embodiments of the inventive process chamber include a showerhead and a liner, both of which are independently tunable. The inventive chamber advantageously allows for greater control of a plasma distribution in the process chamber, thus alleviating non-uniform etching or deposition on a substrate being processed.

FIG. 1 illustrates a schematic view of an exemplary processing chamber (e.g., first and second tandem process chambers 100, 101) in which inventive first and second showerheads 102A,102B and first and second chamber liners 104*a*,104B may be used in accordance with some embodiments of the present disclosure. In some embodiments, the first and second tandem process chambers 100, 101 may be etch chambers. In some embodiments, the first and second tandem process chambers 100, 101 may alternatively be deposition chambers. Each of the respective first and second tandem process chambers 100, 101 include a chamber body having sidewalls 105A,B, a shared interior wall 103, and a bottom 113. The sidewall 105A, shared interior wall 103, and the showerhead 102A of the first tandem process chamber 100 define a first processing region 106 in which a first substrate support 112A is disposed. The sidewall 105B, shared interior wall 103 and the showerhead 102B of the second tandem process chamber 101 define a second processing region 108 in which a second substrate support 112B is disposed. The shared interior wall 103 is shared between the respective first and second tandem process chambers 100, 101 and isolates the processing environment of the processing regions 106, 108 from each other. As such, the processing regions 106, 108 defined in the respective tandem process chambers 100, 101 while process isolated, may share a common pressure, as the lower portion of shared interior wall 103 may allow the respective first and second tandem process chambers 100, 101 to communicate with each other. The lower portion of shared interior wall 103 is defined by a central pumping plenum 117 fluidly coupled to a shared pump 119. Each of the first and second tandem process chambers 100,101 further include adapters 109A,109B to accommodate the shower head assemblies disposed atop the respective chambers.

Each showerhead 102A,102B is configured to dispense a gas from a gas source (not shown) into the respective processing regions 106,108. The showerheads 102A,102B are coupled to respective RF power sources 120A,120B through RF matching networks 122A,122B, respectively to form a plasma within the respective processing regions 106,108. To ensure that each showerhead 102A,102B remains electrically isolated from the remainder of the chamber, first and third insulative rings 110A,110B are respectively disposed beneath the first and second showerheads 102A,102B. In addition, the showerheads 102A,102B are respectively coupled to first and third impedance circuits 114A,114B, respectively, to allow the impedance of the corresponding showerhead to be tuned, thus allowing greater control of the plasma.

To help decrease chamber servicing (i.e., cleaning) time, the chamber liners 104A,104B may be removable. In addition, the inventive chamber liners 104A,104B are respectively coupled to second and fourth impedance circuits 116A,116B, respectively, to allow the impedance of the corresponding chamber liner to be tuned, thus allowing even greater control of the plasma. The first and second chamber liners 104A,104B are respectively disposed atop second and fourth insulative rings 118A,118B to electrically isolate the liners from the chamber.

When the substrate supports 112A,112B are in a processing position, the upper portion of the respective first and second tandem process chambers 100, 101 and substrate supports 112A,112B generally define the respective isolated processing regions 106, 108 to provide process isolation between each of the respective tandem process chambers 100, 101. Therefore, in combination, the sidewalls 105A,B, shared interior wall 103, substrate supports 112A,112B, and the lid 115 provide process isolation between the processing regions 106, 108.

To control the shape of the plasma within the process regions 106,108, the impedances of the showerheads 102A, 102B and the chamber liners 104A,104B may be independently tuned using the first and second impedance circuits. The first and second impedance circuits may be coupled to a controller 125A,125B that controls the relative impedance of the showerheads and the corresponding liners to achieve a desired plasma shape. That is, the impedances of the showerheads and the liners are independently controlled to determine the apportionment of the plasma current between the showerheads and the liners. As such, the first and second impedance circuits may be configured in a master-slave relationship.

Figure 2:
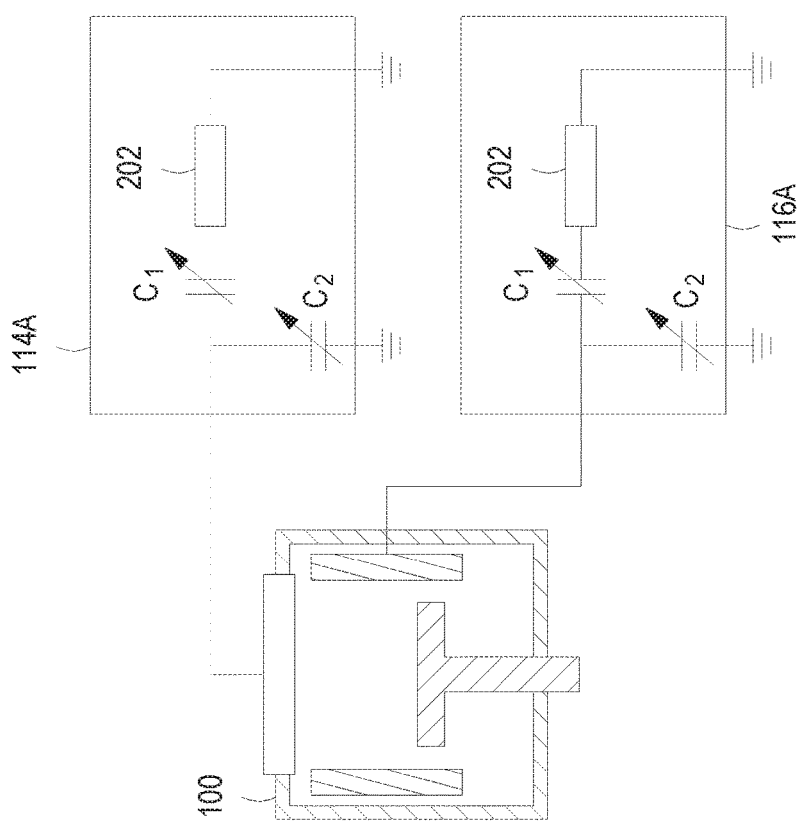
FIG. 2 depicts a schematic view of a circuit coupled to a process chamber in accordance with some embodiments of the present disclosure.

FIG. 2 depicts an exemplary electrical circuit of the first tandem process chamber 100 and corresponding first and second impedance circuits 114A,116A. The third and fourth impedance circuits 114B, 116B are substantially similar to the first and second impedance circuits 114A,116A. As illustrated in FIG. 2, each impedance circuit includes a first tunable capacitor C1 and a second tunable capacitor C2. Each impedance circuit may optionally include a series LR circuit 202 (i.e., series inductor-resistor circuit) in series with the first tunable capacitor C1. However, any variation of capacitors, resistors, or conductors may be utilized to achieve the desired relative impedances of the showerheads and liners.

Figure 3A:
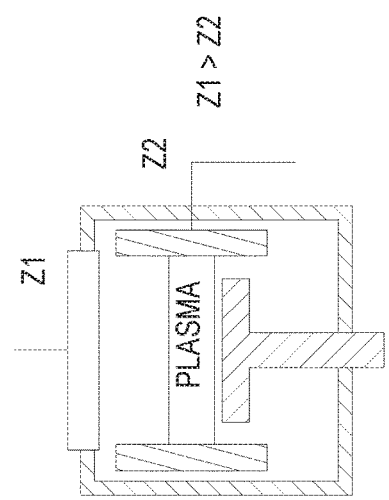
FIGS. 3A-3C depict various scenarios of plasma behavior in the process chamber of FIG. 2.
Figure 3B:
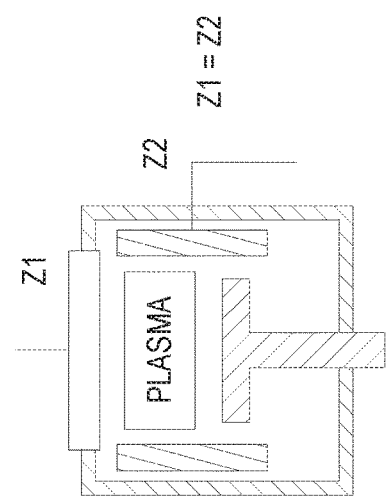
Figure 3C:
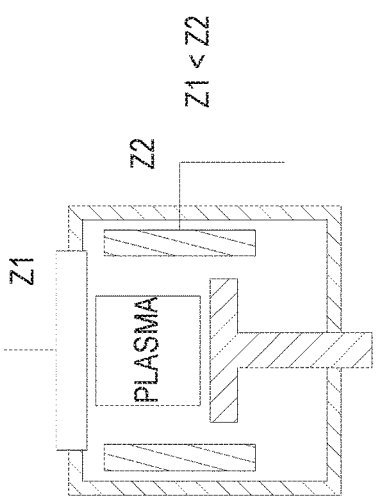

FIGS. 3A-3C depict schematic views of the shape of the plasma formed in the chamber in three scenarios. In the first scenario (FIG. 3A), the impedance of the showerhead is greater than the impedance of the liner. As a result, the plasma current extends from the substrate support to the liner. The shape of the plasma in the first scenario may be beneficial in addressing non-uniformities at the edge of the substrate being processed. In the second scenario (FIG. 3B), the impedance of the showerhead is equal to the impedance of the liner. As a result, the plasma is uniformly distributed in the processing region. In the third scenario (FIG. 3C), the impedance of the showerhead is less than the impedance of the liner. As a result, the plasma current extends from the substrate support to the showerhead. The shape of the plasma in the third scenario may be beneficial in addressing non-uniformities at the center of the substrate being processed.

Although the previous description has been made with regards to a tandem process chamber, the tunable showerhead and tunable liner may be utilized in any process chamber in which manipulation of plasma is desirable.

While the foregoing is directed to some embodiments of the present disclosure, other and further embodiments may be devised without departing from the basic scope of the disclosure.

What is claimed is:
1. A process chamber, comprising:
  a showerhead;
  a chamber liner removably coupled to the process chamber, the chamber liner having a tubular body and a radially outward extending upper flange having a lower surface that supports the chamber liner on walls of the process chamber;
  a first impedance circuit coupled to the showerhead to tune an impedance of the showerhead;
  a second impedance circuit coupled to the chamber liner to tune an impedance of the chamber liner; and
  a controller coupled to the first and second impedance circuits which are connected to each other and configured in a master-slave relationship to control relative impedances of the showerhead and the chamber liner.
2. The process chamber of claim 1, further comprising:
  a first insulative ring disposed between the showerhead and the walls of the process chamber to electrically insulate the showerhead from the process chamber.

3. The process chamber of claim 1, further comprising:
a second insulative ring disposed between the chamber liner and the walls of the process chamber to electrically insulate the chamber liner from the process chamber.

4. The process chamber of claim 1, wherein each of the first and second impedance circuits comprises:
a first tunable capacitor;
a second tunable capacitor; and
a series inductor-resistor (LR) circuit.

5. The process chamber of claim 4, wherein the series LR circuit is disposed in series with the first tunable capacitor.

6. The process chamber of claim 1, further comprising:
a second process chamber comprising:
a second showerhead;
a second chamber liner;
a third impedance circuit coupled to the second showerhead to tune an impedance of the second showerhead;
a fourth impedance circuit coupled to the second chamber liner to tune an impedance of the second chamber liner; and
a second controller coupled to the third and fourth impedance circuits to control relative impedances of the second showerhead and the second chamber liner.

7. The process chamber of claim 6, wherein the process chamber and the second process chamber are part of a tandem process chamber separated by a shared interior wall, and wherein the process chamber and the second process chamber are both fluidly coupled to a shared pump via a central pumping plenum.

8. The process chamber of claim 6, wherein the process chamber and the second process chamber are both etch chambers.

9. The process chamber of claim 6, wherein the process chamber and the second process chamber are both deposition chambers.

10. The process chamber of claim 6, further comprising:
a third insulative ring disposed between the second showerhead and the walls of the second process chamber to electrically insulate the second showerhead from the second process chamber.

11. The process chamber of claim 6, further comprising:
a fourth insulative ring disposed between the second chamber liner and the walls of the second process chamber to electrically insulate the second chamber liner from the second process chamber.

12. A tandem process chamber, comprising:
a first process chamber defining a first substrate processing region, comprising:
a first showerhead;
a first chamber liner removably coupled to the first process chamber, the first chamber liner having a tubular body and a radially outward extending upper flange having a lower surface that supports the first chamber liner on walls of the first process chamber;
a first impedance circuit coupled to the first showerhead to tune an impedance of the first showerhead;
a second impedance circuit coupled to the first chamber liner to tune an impedance of the first chamber liner; and
a first controller coupled to the first and second impedance circuits which are connected to each other and configured to control relative impedances of the first showerhead and the first chamber liner; and
a second process chamber defining a second substrate processing region isolated from the first substrate processing region comprising:
a second showerhead;
a second chamber liner removably coupled to the second process chamber, the second chamber liner having a tubular body and a radially outward extending upper flange having a lower surface that supports the second chamber liner on walls of the second process chamber;
a third impedance circuit coupled to the second showerhead to tune an impedance of the second showerhead;
a fourth impedance circuit coupled to the second chamber liner to tune an impedance of the second chamber liner; and
a second controller coupled to the third and fourth impedance circuits which are connected to each other and configured to control relative impedances of the second showerhead and the second chamber liner.

13. The tandem process chamber of claim 12, wherein the first process chamber are both fluidly coupled to a shared pump via a central pumping plenum.

14. The tandem process chamber of claim 12, further comprising:
a first insulative ring disposed between the first showerhead and the walls of the first process chamber to electrically insulate the first showerhead from the first process chamber; and
a third insulative ring disposed between the second showerhead and the walls of the second process chamber to electrically insulate the second showerhead from the second process chamber.

15. The tandem process chamber of claim 12, further comprising:
a second insulative ring disposed between the first chamber liner and the walls of the first process chamber to electrically insulate the first chamber liner from the first process chamber; and
a fourth insulative ring disposed between the second chamber liner and the walls of the second process chamber to electrically insulate the second chamber liner from the second process chamber.

16. The tandem process chamber of claim 12, wherein each of the first, second, third, and fourth impedance circuits comprises:
a first tunable capacitor;
a second tunable capacitor, and
a series inductor-resistor (LR) circuit.

17. The tandem process chamber of claim 16, wherein the series LR circuit is disposed in series with the first tunable capacitor.

18. A tandem process chamber, comprising:
a first process chamber defining a first substrate processing region, comprising:
a first showerhead;
a first insulative ring disposed between the first showerhead and walls of the first process chamber to electrically insulate the first showerhead from the first process chamber;
a first chamber liner removably coupled to the first process chamber, the first chamber liner having a tubular body and a radially outward extending upper flange having a lower surface that supports the first chamber liner on walls of the first process chamber;

a second insulative ring disposed between the first chamber liner and walls of the first process chamber to electrically insulate the first chamber liner from the first process chamber;

a first impedance circuit coupled to the first showerhead to tune an impedance of the first showerhead;

a second impedance circuit coupled to the first chamber liner to tune an impedance of the first chamber liner; and a first controller coupled to the first and second impedance circuits which are connected to each other and configured to control relative impedances of the first showerhead and the first chamber liner; and a second process chamber defining a second substrate processing region isolated from the first substrate processing region, comprising:

a second showerhead;

a third insulative ring disposed between the second showerhead and walls of the second process chamber to electrically insulate the second showerhead from the second process chamber;

a second chamber liner removably coupled to the second process chamber, the second chamber liner having a tubular body and a radially outward extending upper flange having a lower surface that supports the second chamber liner on walls of the second process chamber;

a fourth insulative ring disposed between the second chamber liner and walls of the second process chamber to electrically insulate the second chamber liner from the second process chamber;

a third impedance circuit coupled to the second showerhead to tune an impedance of the second showerhead;

a fourth impedance circuit coupled to the second chamber liner to tune an impedance of the second chamber liner; and a second controller coupled to the third and fourth impedance circuits which are connected to each other and configured to control relative impedances of the second showerhead and the second chamber liner, wherein each of the first, second, third, and fourth impedance circuits includes a first tunable capacitor, a second tunable capacitor, and a series inductor-resistor (LR) circuit disposed in series with the first tunable capacitor.

\* \* \* \* \*